(12) United States Patent
Chung et al.

(10) Patent No.: US 8,199,603 B2
(45) Date of Patent: Jun. 12, 2012

(54) NONVOLATILE MEMORY DEVICES HAVING VARIABLE-RESISTANCE MEMORY CELLS AND METHODS OF PROGRAMMING THE SAME

(75) Inventors: Won-Ryul Chung, Gyeonggi-do (KR); Byung-Gil Choi, Gyeonggi-do (KR); In-Cheol Shin, Gyeonggi-do (KR); Ki-Won Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 412 days.

(21) Appl. No.: 12/498,549

(22) Filed: Jul. 7, 2009

(65) Prior Publication Data

US 2010/0027327 A1    Feb. 4, 2010

(30) Foreign Application Priority Data

Jul. 31, 2008    (KR) .................. 10-2008-0075257

(51) Int. Cl.
*G11C 8/00*    (2006.01)
(52) U.S. Cl. ......... 365/230.06; 365/189.11; 365/189.16; 365/203
(58) Field of Classification Search ............. 365/230.06, 365/189.16, 189.11, 203
See application file for complete search history.

(56) References Cited

U.S. PATENT DOCUMENTS

| | | | |
|---|---|---|---|
| 6,928,022 B2 * | 8/2005 | Cho et al. ................... | 365/225.7 |
| 7,391,644 B2 | 6/2008 | Cho et al. | |
| 7,580,278 B2 * | 8/2009 | Cho et al. ...................... | 365/163 |
| 7,630,244 B2 * | 12/2009 | Lee .......................... | 365/185.17 |
| 7,668,007 B2 | 2/2010 | Choi et al. | |
| 7,800,944 B2 * | 9/2010 | Chun et al. ............... | 365/185.03 |
| 7,843,722 B2 * | 11/2010 | Im ............................. | 365/185.03 |

FOREIGN PATENT DOCUMENTS

| | | |
|---|---|---|
| JP | 2006-179158 | 7/2006 |
| KR | 100707305 B1 | 4/2007 |
| KR | 1020070056667 A | 6/2007 |

* cited by examiner

*Primary Examiner* — Pho M Luu
(74) *Attorney, Agent, or Firm* — Myers Bigel Sibley & Sajovec, P.A.

(57) ABSTRACT

Nonvolatile memory devices include an array of variable-resistance memory cells and a write driver electrically coupled to the array. The write driver is configured to drive a bit line in the array of variable-resistance memory cells with a stair-step sequence of at least two unequal bit line voltages during an operation to program a variable-resistance memory cell in said array. This stair-step sequence of at least two unequal bit line voltages includes a precharge voltage (e.g., Vcc-Vth) at a first step and a higher boosted voltage (e.g., Vpp-Vth) at a second step that follows the first step.

19 Claims, 8 Drawing Sheets

NONVOLATILE MEMORY DEVICES HAVING VARIABLE-RESISTANCE MEMORY CELLS AND METHODS OF PROGRAMMING THE SAME

REFERENCE TO PRIORITY APPLICATION

This U.S. non-provisional patent application claims priority to Korean Patent Application No. 10-2008-0075257, filed Jul. 31, 2008, the contents of which are hereby incorporated herein by reference.

FIELD OF THE INVENTION

The present invention relates to memory devices and, more particularly, to nonvolatile memory devices and methods of operating same.

BACKGROUND

Semiconductor memory devices may be classified into volatile memory devices and non-volatile memory devices. Volatile memory devices lose their stored data when their power supplies are interrupted, while non-volatile memory devices retain their stored data even when their power supplies are interrupted. Volatile memory devices may include, for example, dynamic random access memory (DRAM) and static random access memory (SRAM). Non-volatile memory devices may include, for example, programmable read only memory (PROM), erasable programmable read only memory (EPROM), electrically erasable programmable read only memory devices (EEPROM), and flash memory.

With the recent trend toward higher performance and lower power consumption of semiconductor devices, next-generation semiconductor memory devices such as ferroelectric random access memory (FRAM), magnetic random access memory (MRAM), and phase change random access memory (PRAM) have been developed. Resistances of constituent materials for these next-generation semiconductor memory devices are variable with current or voltage. Thus, the constituent materials are characterized in that their resistances are maintained even when the supply of current or voltage is cut off.

Among the variable resistance memory devices, phase change memory devices (PRAM) using phase change materials have a high operation speed and are configured to achieve a high integration density. Therefore, PRAM devices are increasingly developed.

SUMMARY

Nonvolatile memory devices according to embodiments of the present invention include an array of variable-resistance memory cells and a write driver electrically coupled to the array. The write driver is configured to drive a bit line in the array of variable-resistance memory cells with a stair-step sequence of at least two unequal bit line voltages during an operation to program a variable-resistance memory cell in said array. This stair-step sequence of at least two unequal bit line voltages includes a precharge voltage (e.g., Vcc-Vth) at a first step and a higher boosted voltage (e.g., Vpp-Vth) at a second step that follows the first step. In particular, the write driver operates to drive the bit line with a first stair-step sequence of at least two unequal bit line voltages during an operation to program the variable-resistance memory cell into a set state. Alternatively, the write driver operates to drive the bit line with a second stair-step sequence of at least two unequal bit line voltages during an operation to program the variable-resistance memory cell into a reset state. According to some of these embodiments of the invention, the magnitudes of the voltages in the first stair-step sequence are equivalent to magnitudes of the voltages in the second stair-step sequence, however, duration of the first stair-step sequence is greater than the duration of the second stair-step sequence.

According to additional embodiments of the invention, the write driver includes a precharge circuit configured to precharge the bit line with a first of the at least two unequal bit line voltages in response to a precharge control signal. The write driver may also include a current driver having a PMOS pull-up transistor and an NMOS pull-down transistor therein, electrically coupled in series. The precharge circuit is configured to pull-up an output of the current driver when enabled during the program operation. The write driver may also include a current control circuit having an output electrically coupled to a gate electrode of the PMOS pull-up transistor and a pulse selection circuit electrically coupled to said the control circuit and a gate electrode of the NMOS pull-down transistor. This pulse selection circuit, which may be responsive to a data signal and reset and set pulse signals, may also be configured to pass the data signal to the current control circuit. The current control circuit may also be responsive to a bias signal (e.g., DC_BIAS) and a data signal generated by the pulse selection circuit. The memory device may also include a global bit line selection circuit, which is electrically coupled to the output of the current driver, and a local bit line selection circuit, which is electrically coupled to an output of the global bit line selection circuit and the bit line in the array of variable-resistance memory cells.

DETAILED DESCRIPTION OF THE EMBODIMENTS

The present invention will now be described more fully with reference to the accompanying drawings, in which exemplary embodiments of the invention are shown. The present invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. In the following description, it will be understood that when an element is referred to as being "connected to" or "coupled to" another element, it may be directly connected to or coupled to the other element or intervening elements may also be present. In contrast, when an element is referred to as being "directly connected to" or "directly coupled to" another element, there are no intervening elements present. The terms "and/or" comprise each and at least one combination of referenced items.

Although terminology such as "the first" and "the second" are used to describe various elements, components, and/or sections, such elements, components, and/or sections are not limited to the terminology. Such terminology is used to distinguish one element, component, and/or section from another element, component, and/or section. Therefore, the first element, the first component, and the first section mentioned in the present disclosure may be the second element, the second component, and the second section within the technical concept.

As used herein, certain terminologies are used to explain the exemplary embodiments. It is understood that these terminologies are not limiting. Unless specifically stated, a word in singular form also represents plural form. The terms "comprise" and/or "comprising" used in the specification may include elements, steps, operations and/or devices specifically mentioned in the specification, as well as other elements, steps, and operations, and/or devices. Moreover, the terms "write" and "program" are used interchangeably in this written description.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As shown in the drawings, space-related terminologies, such as "below," "beneath," "lower," "above," and "upper" are intended to be used to aid the understanding of the relationship between elements. Spatially-related terminology is to be considered in the context of the direction specified in associated drawings. In addition, it is to be understood in the context of two different directions of an element when the element is in use or operation. For example, if an element shown in a drawing is flipped in the vertical direction, the element which is described as "below" or "beneath" another element will now be "above" the other element. Therefore, the exemplary terminology "below" can include both below and above relationships. An element can also be positioned in different relative directions, and as a result spatially-related terminologies may be interpreted differently, depending on the relative position of an element.

A variable resistance memory device according to an embodiment of the present invention and a method of writing the same will now be described with reference to accompanying drawings.

Figure 1A:
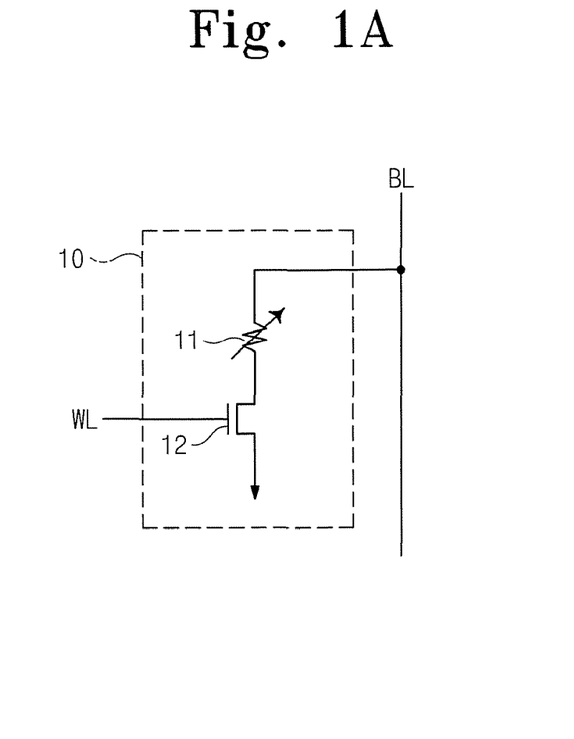
FIGS. 1A and 1B are circuit diagrams of unit memory cells of a variable resistance memory device, respectively.
Figure 1B:
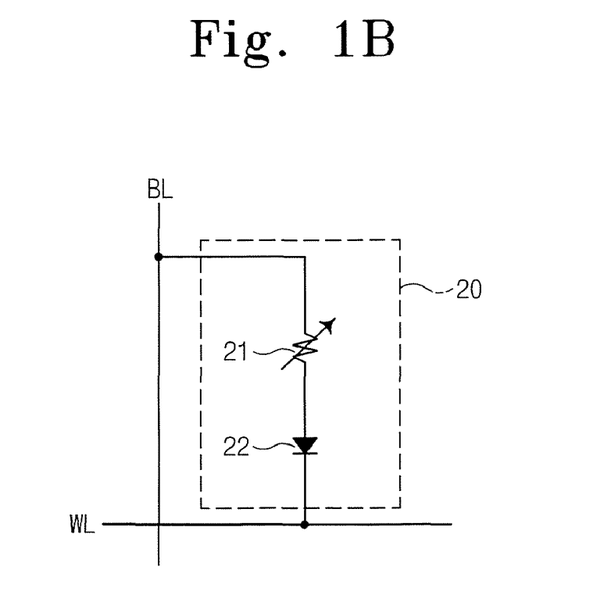
Figure 2:
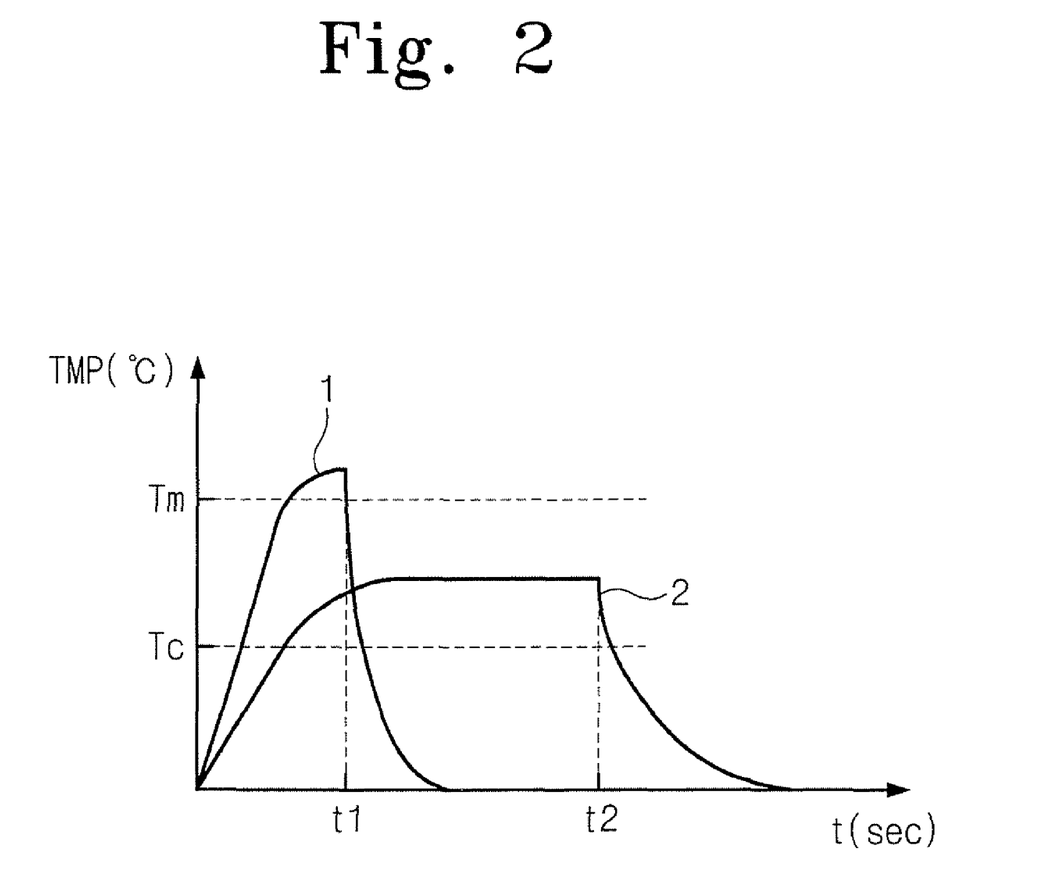
FIG. 2 is a graph illustrating characteristics of a variable resistor material.

With reference to FIGS. 1A and 1B, unit memory cells of a variable resistance memory device according to an embodiment of the present invention will be described. FIGS. 1A and 1B are circuit diagrams of unit memory cells of a variable resistance memory device, respectively. FIG. 2 is a graph illustrating characteristics of a variable resistor material.

Referring to FIG. 1A, a memory cell 10 includes a variable resistor 11 and a selector 12. The variable resistor 11 is coupled between a bitline BL and the selector 12, and the selector 12 is coupled between the variable resistor 11 and a ground.

The variable resistor 11 includes a phase change material, such as Ge—Sb—Te (GST), whose resistance varies with temperature. According to temperature variation, the phase change material has an amorphous state exhibiting relatively high resistance and a crystalline state exhibiting relatively low resistance. The state of the variable resistor 11 may be determined, based on the amount of current supplied through the bitline BL.

The selector 12 may be comprised of an NMOS transistor. A wordline WL is connected to a gate of the NMOS transistor. Thus, supply of current flowing to the variable resistor 11 is controlled according to a voltage of the wordline WL. Although the selector 12 coupled between the variable resistor 11 and the ground is shown in FIG. 1, it may be coupled between the bitline BL and the variable resistor 11.

Similar to the memory cell 20 shown in FIG. 1A, a memory cell 20 shown in FIG. 1B includes a variable resistor 21 and a selector 22. However, a diode is used as the selector 22 of the memory cell 20 shown in FIG. 1B.

Referring now to FIG. 1B, the variable resistor 21 is coupled between a bitline BL and the selector 22, and the selector 22 is coupled between the variable resistor 21 and a wordline WL. An anode of the selector 22 (i.e., diode) is connected to the variable resistor 21, and a cathode thereof is connected to the wordline WL. That is, when a difference between voltages of the anode and the cathode becomes higher than a threshold voltage of the diode, the diode may be turned on to supply current to the variable resistor 21.

Characteristics of a phase change material included in the memory cells shown in FIGS. 1A and 1B will now be described with reference to a graph of FIG. 2.

Referring to FIG. 2, if a phase change material of a variable resistor is rapidly cooled after being heated at a temperature higher than a melting point Tm for a time interval t1, it may exhibit an amorphous state where a reset state or data "1" is stored. Meanwhile, if the phase change material is slowly cooled after being heated at a temperature higher than a crystallization temperature Tc and lower than the melting temperature Tm for a time interval t2 longer than the t1, it my exhibit a crystalline state where a set state or data "0" is stored. Thus, data may be stored by supplying current to the phase change material and read out by measuring resistance of the phase change material.

A variable resistance memory device including memory cells employing a phase change material having the foregoing characteristics will now be described with reference to a block diagram in FIG. 3.

Figure 3:
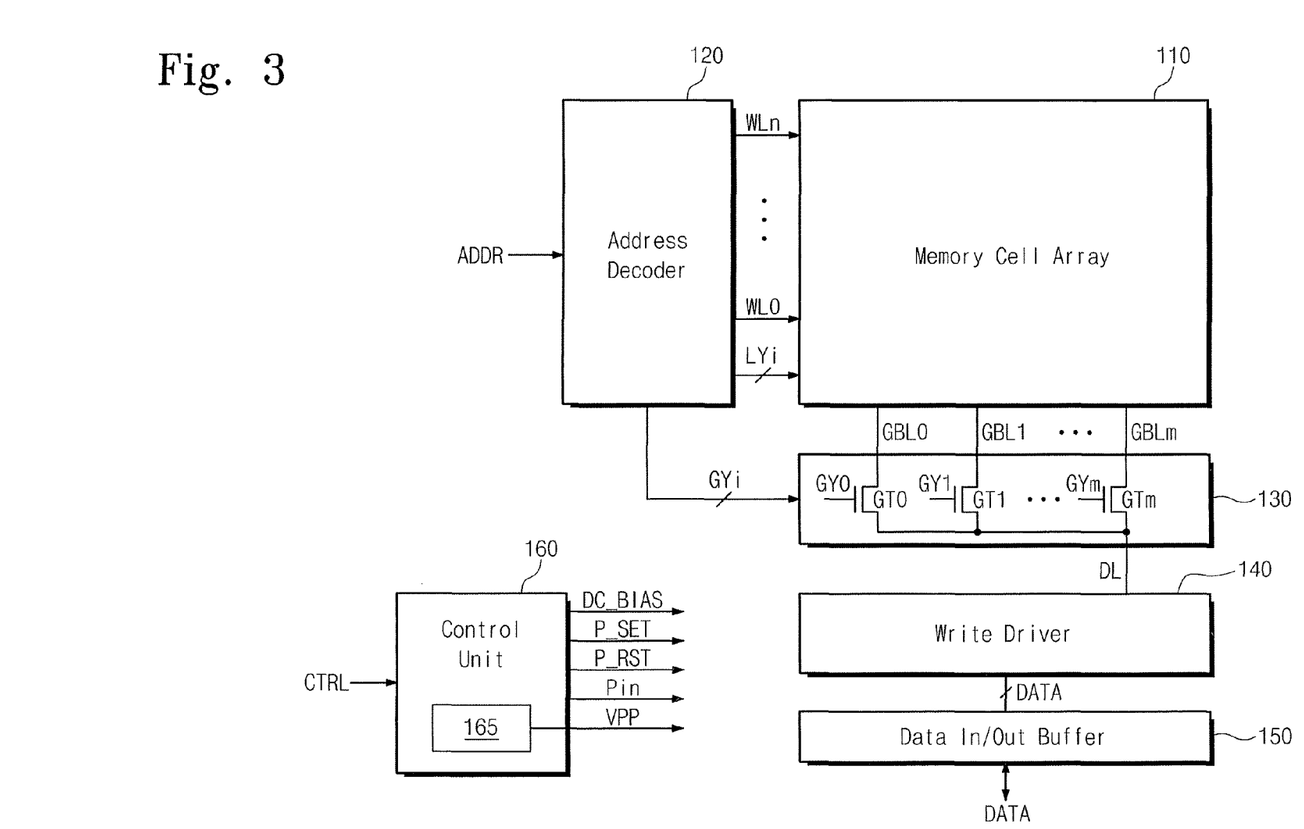
FIG. 3 is a block diagram of a variable resistance memory device according to embodiments of the present invention.

Referring to FIG. 3, a variable resistance memory device includes a memory cell array 110, an address decoder 120, a global bitline selection unit 130, a write driver 140, a data input/output buffer 150, and a control unit 160.

The memory cell array 110 is connected to a plurality of wordlines WL0-WLn and a plurality of global bitlines GBL0-GBLm. The memory cell array 110 includes a plurality of phase change memory cells, as shown in FIGS. 1A and 1B. The configuration of the memory cell array 110 will be described in detail later with reference to FIG. 4.

The address decoder 120 is connected to the memory cell array 110 through the wordlines WL0-WLn. The address decoder 120 decodes an externally input address ADDR to select a bitline and a wordline. The address ADDR is classified into a row address for selecting the wordlines WL0-WLn and a column address for selecting bitlines. Note that the bitlines includes the global bitlines GBL0-GBLm and local bitlines LBL0-LBLm (shown in FIG. 4). That is, the address decoder 120 generates a local selection signal LYi for selecting the local bitlines LBL0-LBLm and a global selection signal GYi for selecting the global bitlines GBL0-GBLm. The local selection signal LYi is provided to the memory cell array 110, and the global selection signal GYi is provided to the global bitline selection unit 130.

The global bitline selection unit 130 selects the global bitlines GBL0-GBLm in response to the global selection signal GYi provided from the address decoder 120. The global bitline selection unit 130 includes a plurality of global bitline selection transistors GT0-GTm, which electrically connect the global bitlines GBL0-GBLm to a data line DL in response to the global selection signal GYi.

As shown in the figure, each of the global bitline selection transistors GT0-GTm is comprised of NMOS transistors. However, each of the global bitline selection transistors GT0-GTM may be comprised of PMOS transistors or NMOS and PMOS transistors.

The write driver 140 provides program (i.e., write) current to a selected global bitline (e.g., GBL0) through the data line DL. In other words, the write driver 140 receives a set pulse P_SET or a reset pulse P_RST from the control unit 160 to generate set current or reset current. The write driver 140 receives data DATA from the data input/output buffer 150 to supply the set current or reset current to a selected global bitline. The write driver 140 may control the amount of current supplied to global and local bitlines according to a bias voltage DC_BIAS provided from the control unit 160.

That is, the write driver 140 supplies the set current in response to the set pulse P_SET when receiving data "0" and supplies the reset current in response to the reset pulse P_RST when receiving data "1".

The configuration of the write driver 140 will be described in detail later with reference to FIG. 5.

The control unit 160 output control signals according to an externally provided command signal CTRL. That is, the control unit 160 may output the set pulse P_SET or the reset pulse P_RST and a driving voltage of the write driver 140. The write driver 140 uses boosted voltage VPP as the driving voltage. Accordingly, the control unit 160 includes a boosted voltage generator 165 configured to generate the boosted voltage VPP. For example, the boosted voltage generator 165 may boost a power supply voltage Vcc using a charge pump to output a boosted voltage VPP. The boosted voltage generator 165 may output a first boosted voltage VPP1 and a second boosted voltage VPP2 which are higher than the power supply voltage Vcc and have different levels.

The control unit 160 activates the boosted voltage generator 165 while a write signal of the write driver 160 is enabled. Also, the control unit 160 activates a precharge control signal Pin while the write signal of the write driver is enabled.

The configuration of the memory cell array 110 will be described more fully with reference to a circuit diagram in FIG. 4.

Figure 4:
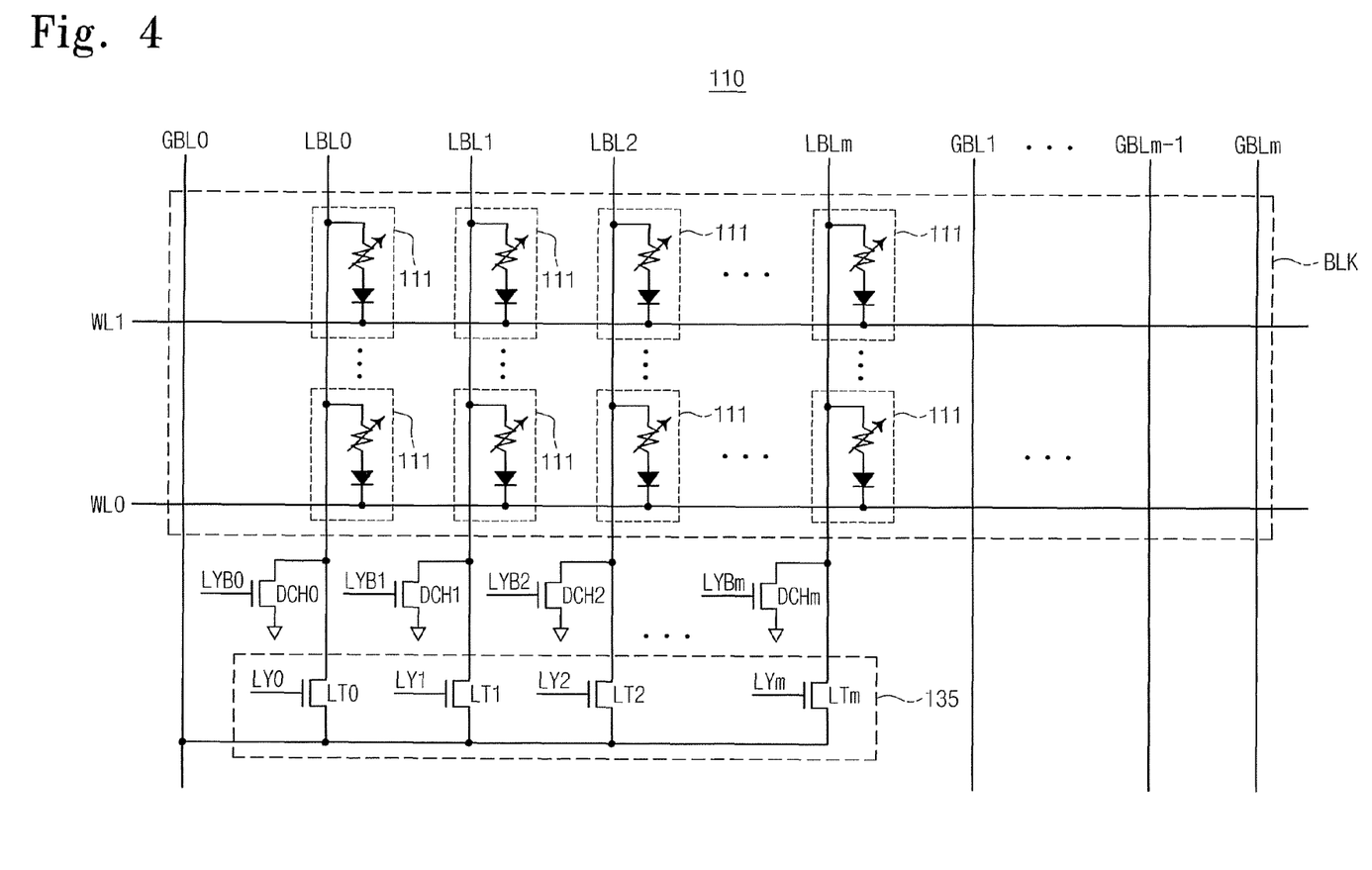
FIG. 4 is a circuit diagram of a memory cell array shown in FIG. 3.

As shown in FIG. 4, the memory cell array 110 includes a plurality of blocks BLK, a plurality of global bitlines GBL0-GBLm, a local bitline selection unit 135, and a plurality of discharge transistors DCH0-DCHm.

Each of the blocks BLK includes a plurality of phase change memory cells 111, which are connected to wordlines WL0-WLn and local bitlines LBL0-LBLm, respectively. As shown in FIGS. 1A and 1B, each of the memory cells 111 is comprised of a variable resistor and a selector. The variable resistor includes a phase change material, and the selector includes a diode or an NMOS transistor.

The local bitlines LBL0-LBLm are connected to the global bitlines GBL0-GBLm. In other words, a plurality of local bitlines LBL0-LBLm may be connected to one global bitline (e.g., GBL0). That is, a bitline may have a hierarchical structure using a plurality of global bitline GBL0-GBLm and a plurality of local bitlines LBL0-LBLm.

The local bitline selection unit 135 may be comprised of local bitline selection transistors LT0-LTm, which are connected to the local bitlines LBL0-LBLm, respectively. That is, the local bitline selection transistors LT0-LTm electrically connect a local bitline LBLm to a global bitline GBLm in response to local selection signals LYS0-LYSm which may be provided from an address decoder (120 in FIG. 3).

The discharge transistors DCH0-DCHm discharge voltages of the local bitlines LBL0-LBLm after and before a write or read operation. The discharge transistors DCH0-DCHm are coupled between a local bitline and a ground voltage and discharge the local bitlines LBL0-LBLm in response to complementary signals LYB0-LYBm of the local selection signals LY0-LYm. That is, when the local bitline selection transistors LT0-LTm are turned on, the discharge transistors DCH0-DCHm are turned off.

The write driver 140 shown in FIG. 3 will now be described below in detail with reference to a circuit diagram in FIG. 5.

Figure 5:
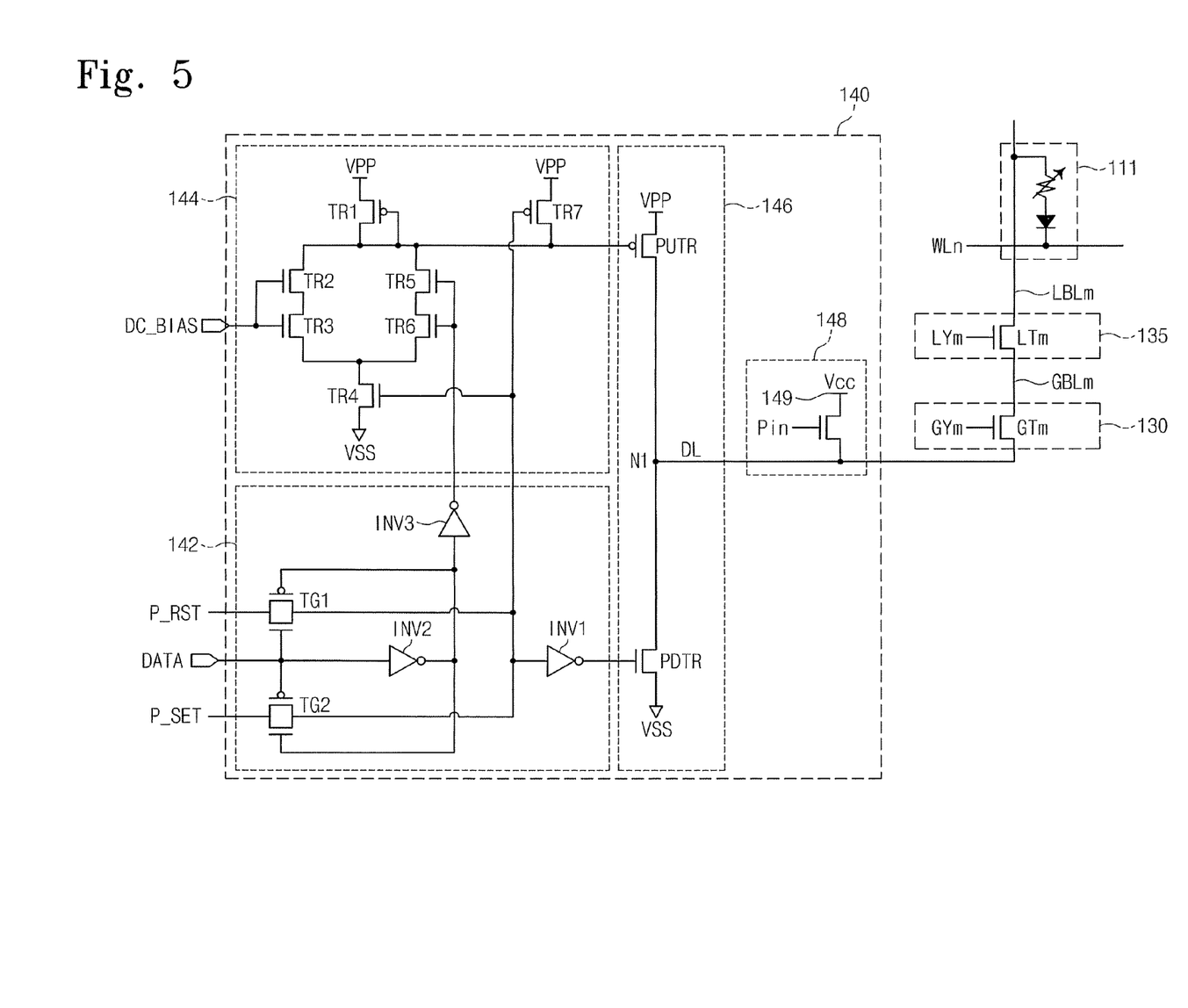
FIG. 5 is a circuit diagram of a write driver constructed in a variable resistance memory device according to embodiments of the present invention.

As shown in FIG. 5, the write driver 140 includes a pulse selection unit 142, a current control unit 144, a current driving unit 146, and a precharge unit 148 and operates using a boosted voltage VPP as a driving voltage. The configuration including the pulse selection unit 142, the current control unit 144, the current driving unit 146, and the precharge unit 148 is merely exemplary in nature and is in no way intended to limit the invention.

The pulse selection unit 142 outputs either one of a set pulse P_SET or a reset pulse P_RST, based on data DATA. The reset pulse P_RST or the set pulse P_SET is a current pulse, and an enable duration of the reset pulse P_RST is shorter than that of the set pulse P_SET.

The pulse selection unit 142 includes first and second transmission gates TG1 and TG2 and first to third inverters INV1-INV3.

The first transmission gate TG1 outputs a reset pulse P_RST in response to a logic level of data DATA, and the second transmission gate TG2 outputs a set pulse P_SET in response to a logic level of data DATA. When one of the transmission gates TG1 and TG2 is turned on, the other is turned off. That is, the transmission gates TG1 and TG2 operate complementarily.

The first inverter INV1 inverts an output of the first transmission gate TG1 or the second transmission gate TG2 and provides an inverted version of the output to the current driving unit 146. The second and third inverters INV2 and INV3 buffer data DATA and provides a buffered version of the data DATA to the current control unit 144.

That is, when data is "0" and a set pulse P_SET is enabled, the pulse selection unit 142 transfers the set pulse P_SET to the current control unit 144. And when data is "1" and a reset pulse P_RST is enabled, the pulse selection unit 142 transfers the reset pulse P_RST to the current control unit 144.

The current controller 144 includes first to seventh transistors TR1-TR7. The second to sixth transistors TR2-TR6 are NMOS transistors, and the first and seventh transistors TR1 and TR7 are PMOS transistors.

The first transistor TR1 has a source connected to a boosted voltage VPP, a gate, and a drain cross-coupled to the gate. As mentioned above, the first transistor TR1 is a PMOS transistor.

The second to fourth transistors TR2, TR3, and TR4 are serially coupled between the drain and a ground voltage of the first transistor TR1. As mentioned above, the second to fourth transistors TR2, TR3, and TR4 are NMOS transistors. A bias voltage DC_BIAS is applied to gates of the second and third transistors TR2 and TR3.

The bias voltage DC_BIAS has a stable voltage level and makes the current control unit 144 to consistently operate. The voltage level of the bias voltage DC_BIAS is variable through an exterior option pad (not shown).

The amount of program current corresponding to the reset pulse P_RST and the set pulse P_SET varies with a level of the bias voltage DC_BIAS. That is, the write driver 140 may enable an output level of the current control unit to rise or fall in response to the level fluctuation of the bias voltage DC_BIAS.

The set pulse P_SET or the reset pulse P_RST selected by the pulse selection unit 142 is applied to a gate of the fourth transistor TR4 to control an operation of the current control unit 144.

The fifth and sixth transistors TR5 and TR6 are serially coupled between the drain of the first transistor TR1 and the drain of the fourth transistor TR4. Data DATA is applied to gates of the fifth and sixth transistors TR5 and TR6.

The seventh transistor TR7 is a PMOS transistor and has a source connected to the boosted voltage VPP, a drain connected to the drain of the first transistor, and a gate to which the reset pulse P_RESET or the set pulse P_SET is applied.

In the current control unit 144, the first and seventh transistors TR1 and TR7, which are PMOS transistors, constitute a current mirror. The first to fourth transistors TR1, TR2, TR3, and TR4 receive a bias voltage DC_BIAS to form a first current path. The first, fifth, sixth, and fourth transistors TR1, TR5, TR6, and TR4 receive a set pulse P_SET signal or a reset pulse P_RST signal to form a second current path.

The current driving unit 146 includes a pull-up transistor PUTR and a pull-down transistor PDTR. The pull-up transistor PUTR has a source connected to the boosted voltage VPP, a drain connected to an output node N1, and a gate to which an output signal of the current driving unit 146 is applied. The pull-down transistor PDTR has a drain connected to the output node N1, a source connected to a ground voltage VSS, and a gate to which an inverted version of the reset pulse P_RST signal or the set pulse P_SET signal is applied.

The current driving unit 146 supplies set current or reset current to a selected memory cell through a data line DL in response to an output signal of the current control unit 144 during an enable duration of the reset pulse P_RST or the set pulse P_SET, i.e., a write operation of the memory device. The amount of current in the current control unit 144 may be changed according to the input pulses of the current control unit 144. So a voltage level of the output signal of the current control unit 144 may be changed. Therefore, a voltage level applied to gate electrode of the pull-up transistor PUTR of the current driving unit 146 is changeable according to the output signal of the current control unit 144. That is, it is possible to control the degree that the pull-up transistor PUTR is turned on according to the output signal of the current control unit 144. Thus, the amount of the set current or the reset current applied to the memory cell 111 is controlled. During a disable duration of the reset pulse P_RST or the set pulse P_SET, i.e., non-operating period of the memory device, the pull-down transistor PUTR is turned on to discharge the output node N1.

The output node N1 of the current driving unit 146 supplies set current or reset current to a memory cell through the data line DL. More specifically, the output node N1 of the current driving unit 146 is connected to the global bitline selection unit 130 through the data line DL, and a selected global bitline (e.g., GBL) is connected to the local bitline selection unit 135. That is, the set current or the reset current output from the current driving unit 146 is supplied to the memory cell through the selected global bitline GBL and a local bitline (e.g., LBL).

In other words, when the set pulse P_SET is selected from the pulse selection unit 142, the fifth and sixth transistors TR5 and TR6 are turned off to make the set current flowing through a first current path flow to the pull-up transistor PUTR. When the reset pulse P_RST is selected from the pulse selection unit 142, the fifth and sixth transistors TR5 and TR6 are turned on to make the reset current flowing through first and second current paths flow to the pull-up transistors PUTR. That is, the set current flowing to the pull-up transistor PUTR by the set pulse P_SET is smaller than the reset current flowing to the pull-up transistor PUTR by the reset pulse P_RST.

Likewise when set current or reset current is supplied to a memory cell, a voltage at the output node N1 of the current driving unit 146 rises to a boosted voltage VPP from a voltage of zero (0) for a short time. That is, a voltage of a selected global bitline and a selected local bitline is charged to the boosted voltage VPP from the voltage of zero (0).

As a result, within a short time, a great voltage difference occurs at sources and drains of the pull-up transistors PUTR in the current driving unit 146 and transistors GTm and LTm in the global bitline selection unit 130 and the local bitline selection unit 135.

Likewise when a great voltage difference occurs at sources and drains of transistors, hot electron may be generated at a channel of the pull-up transistor PUTR which is a PMOS transistor to cause hot electron induced punch-through (HEIP). Thus, a threshold voltage of the pull-up transistor may be reduced to increase leakage current when the pull-up transistor PUTR is turned off. Due to a high electric field applied to a gate of a transistor, hot carrier injection (HCI) may occur at the transistors GTm and LTm which are NMOS transistors.

Accordingly, the write driver 140 includes a precharge unit 148 configured to precharge a data line DL, a global bitline GBL, and a local bitline LBL to a lower voltage (e.g., power supply voltage VCC) than the boosted voltage VPP before supplying set current or reset current to a memory cell. A precharge voltage precharges a selected global bitline GBLm and a selected local bitline LBLm. In order to prevent current from flowing to a memory cell, the precharge unit 148 may be comprised of an NMOS transistor to precharge the bitlines GBLm and LBLm to a lower voltage than the power supply voltage VCC.

The precharge unit 148 may be coupled between a power terminal 149 and a data line DL (i.e., the output node N1 of the current driving unit 146) and controlled by a precharge control signal Pin. The power supply voltage VCC may be applied to the power terminal 149. The precharge unit 148 is connected to the data line DL to precharge the data line DL to the power supply voltage VCC before writing data into a memory cell. Practically, the data line DL is precharged to a voltage of VCC-Vth by a threshold voltage Vth of an NMOS transistor. The precharge unit 148 may be controlled by the control signal Pin supplied from the control unit 160. The control signal Pin is enabled while data DATA is input and the power supply voltage VCC rises to the boosted voltage VPP and disabled before the set pulse P_SET or the reset pulse P_RST is enabled.

According to the embodiments of the present invention, the precharge unit 148 is comprised of an NMOS transistor. However, the present invention is not to these embodiments and the precharge unit 148 may be comprised of a PMOS transistor.

In addition, when the data line DL is precharged to a power supply voltage by the precharge unit 148, a selected global bitline GTm and a selected local bitline LTm are precharged to the power supply voltage.

According to an exemplary embodiment, before supplying set current or reset current to a memory cell, a data line DL, a selected global bitline GBm, and a selected local bitline LBLm may be precharged to a power supply voltage VCC by the precharge unit 148 to prevent degradation of transistors during a data writing operation.

A write operation of a variable resistance memory device according to an embodiment of the present invention will now be described with reference to a timing view in FIG. 6.

Figure 6:
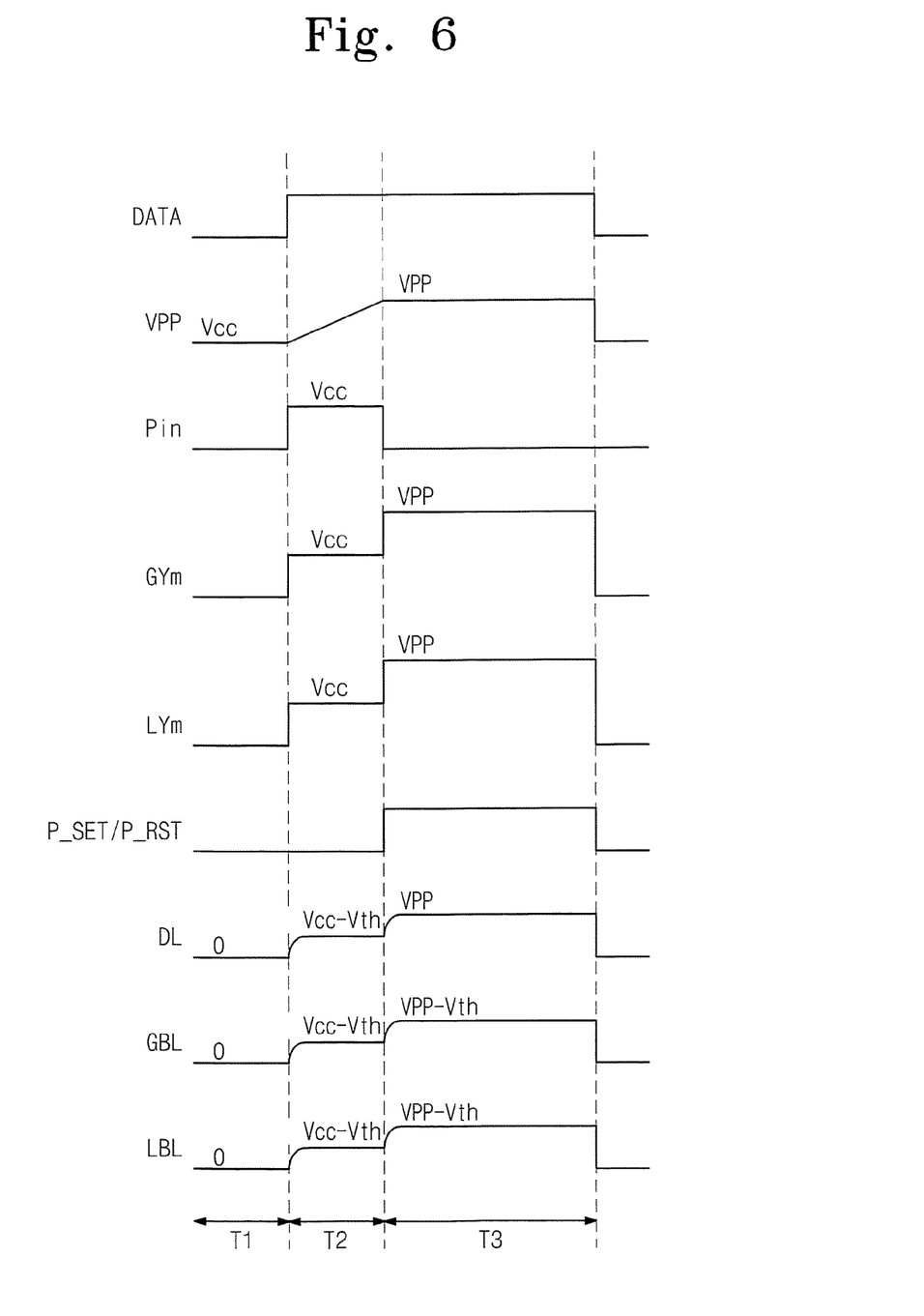
FIG. 6 is a timing view illustrating operations of a variable resistance memory device according to an embodiment of the present invention.

Referring to FIG. 6, a write operation includes a discharge duration T1, a precharge duration T2, and a write duration T3.

For a write operation, row and column addresses are provided to a memory cell array through an address decoder 120 to select a memory cell 111 into which data is to be written.

At the discharge duration T1, a data line DL and global and local bitlines GBL and LBL are discharged to a ground voltage. That is, since data DATA is low, a pull-down transistor PDTR of a current driving unit 146 is turned on to discharge the data line DL, the global and local bitlines GBL and LBL to the ground voltage.

At the precharge duration T2, the data line DL, the global and local bitlines GBL and LBL are precharged using a power supply voltage (i.e., VCC-Vth).

Specifically, data DATA to be written into a memory cell is provided to a write driver 140 through a data input/output buffer 150. When the data DATA is input, an output voltage of a boosted voltage generator 165 rises to a boosted voltage from a power supply voltage VCC. That is, as the data DATA is input, a boosted voltage generation signal is enabled at the boosted voltage generator 165 and thus the power supply voltage VCC rises to the boosted voltage VPP.

When the data DATA is input to the write driver 140, a precharge unit control signal Pin of the write driver 140 is enabled to turn on an NMOS transistor of a precharge unit 148. Thus, the data line DL is precharged using a voltage of VCC-Vth. When the data DATA is input, selected global and local bitline selection signals GYm and LYm are enabled to a power supply voltage level. Accordingly, global and local bitline selection transistors GTm and LTm are turned on to precharge the global and local bitlines GBL and LBL using the voltage of VCC-Vth.

At the write duration T3, a set pulse P_SET or a reset pulse P_RST is enabled to turn on the pull-up transistor PUTR of the current driving unit 146. Before the set pulse P_SET or the reset pulse P_RST is enabled, the precharge control signal Pin is disabled to turn off an NMOS transistor of the precharge unit 148. When the set pulse P_SET or the reset pulse P_RST is enabled, the voltage level of the global and local selection signals GYm and LYm rises to the boosted voltage VPP. Thus, the data line DL is charged to the boosted voltage VPP, and the selected global bitline GBL and the local bitline LBL are charged to a voltage of VPP~VPP-Vth. As a result, set current or reset current is supplied to a memory cell from an output node N1 of the current driving unit 146 through the data line DL, the global bitline GBL, and the local bitline.

Figure 7:
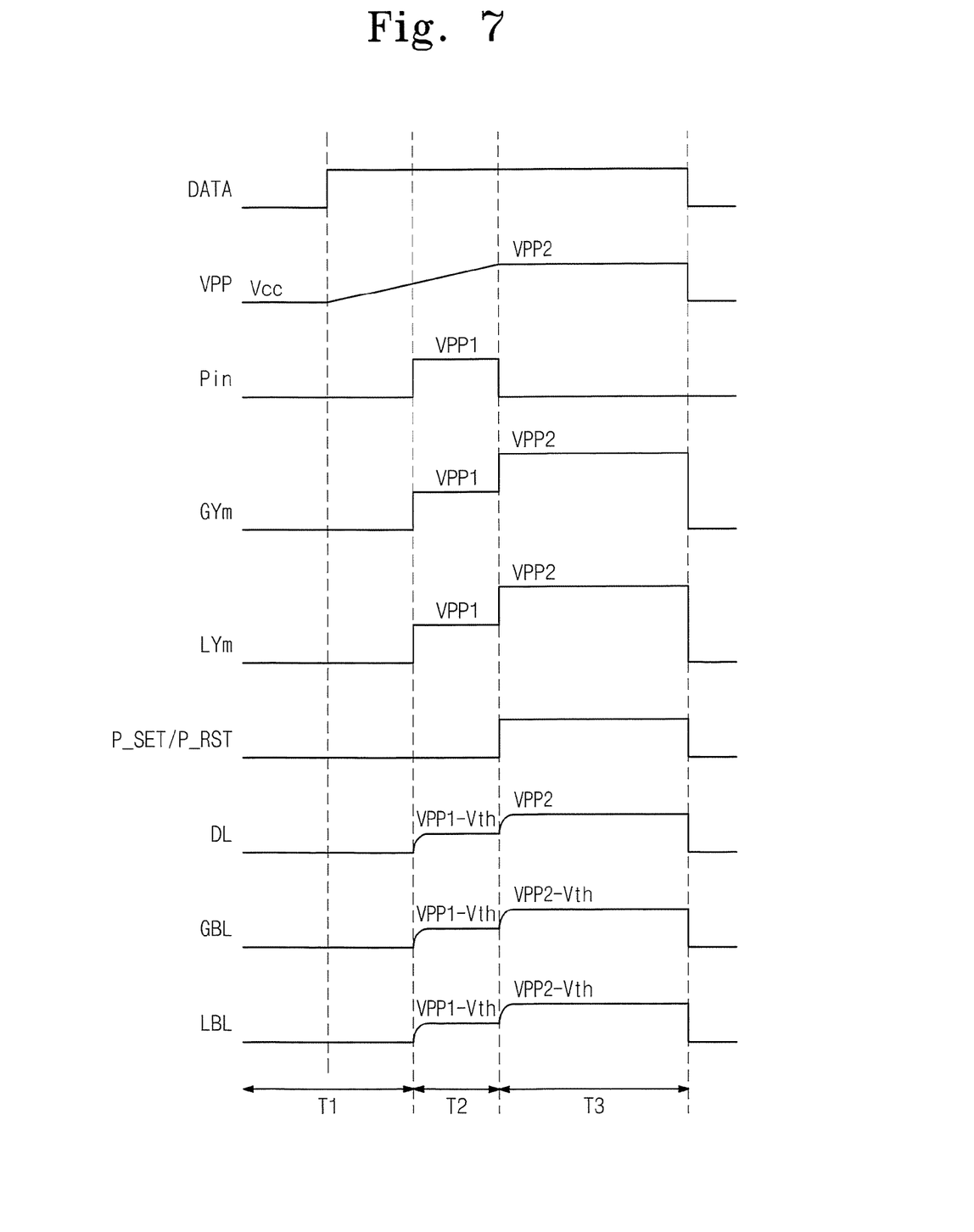
FIG. 7 is a timing view illustrating operations of a variable resistance memory device according to another embodiment of the present invention.

A variable resistance memory device according to another embodiment of the present invention will now be described with a timing view in FIG. 7.

In this embodiment, a data line DL, a global bitline GBL, and a local bitline LBL may be charged to a second boosted voltage VPP2 after being precharged to a power supply voltage VCC.

That is, a write driver 140 is driven by the second boosted voltage VPP2 (e.g., 5 volt), and a precharge unit (148 in FIG. 5) is controlled by a precharge control signal Pin activated to a first boosted voltage VPP1 (e.g., 3 volt). The first boosted voltage VPP1 is higher than the power supply voltage VCC and lower than the second boosted voltage VPP2. The first boosted voltage VPP1 may be supplied from a boosted voltage generator through a charge pump while the power supply voltage VCC rises to a second boosted voltage VPP2. More specifically, for a write operation, row and column addresses are provided to a memory cell array through an address decoder 120 and memory cells 111 into which data is to be written are selected.

At a discharge duration T1, the data line DL and the global and local bitlines GBL and LBL are discharged to a ground voltage. That is, since data DATA is low, a pull-down transistor PDTR of a current driving unit 146 is turned on to discharge the data line DL and the global and local bitlines GBL and LBL to a ground voltage.

At a precharge duration T2, the data line DL and the global and local bitlines GBL and LBL are precharged to a power supply voltage VCC. More specifically, when the data DATA is input to the write driver 140, an output voltage of the boosted voltage generator 165 rises to a second boosted voltage VPP2 from the power supply voltage VCC. That is, as the data DATA is input, a boosted voltage generation signal is enabled at the boosted voltage generator 165 to make the power supply voltage VCC rise to the second boosted voltage VPP2.

While the power supply voltage VCC rises to the second boosted voltage VPP2, a precharge control signal Pin of the write driver 140 is enabled to a level of the first boosted voltage VPP1. Thus, an NMOS transistor of a precharge unit 148 is turned on to precharge the data line DL to the power supply voltage VCC. When the control signal Pin is enabled, selected global and local bitline selection signals GYm and LYm are enabled to a level of the first boosted voltage VPP1. Thus, the global and local bitline selection signals GYm and LYm are turned on to precharge global and local bitline GBL and LBL to the power supply voltage VCC.

At a write duration T3, a set pulse P_SET or a reset pulse P_RST is enabled to turn on a pull-up transistor PUTR of the current driving unit 146. Before the set pulse P_SET or the reset pulse P_RST is enabled, the precharge control signal Pin is disabled to turn off the set pulse P_SET or the reset pulse P_RST. When the set pulse P_SET or the reset pulse P_RST is enabled, a voltage level of the global and local selection signals GYm and LYm rises to a level of the second boosted voltage VPP2. Accordingly, the data line DL is charged to the second boosted voltage VPP2 by the pull-up transistor PUTR, and the selected global bitline GBL and local bitline LBL are charged to a voltage of VPP2~VPP2-Vth.

Figure 8:
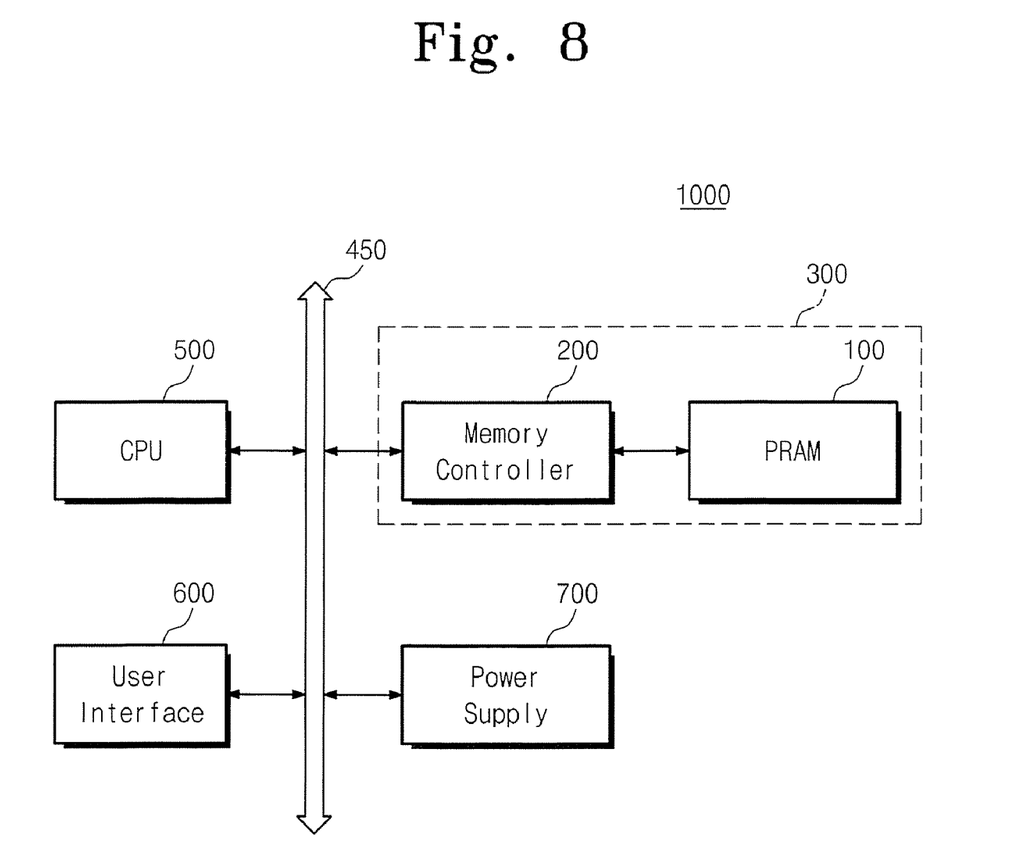
FIG. 8 is a block diagram of a memory system including a variable resistance memory device according to embodiments of the present invention.

FIG. 8 is a block diagram of a memory system 1000 including a variable resistance memory device according to the embodiments of present invention. The memory system 1000 includes a semiconductor memory device 300 comprised of a variable resistance memory device (e.g., PRAM) 100 and a memory controller 200, a central processing unit (CPU) 500 connected to a system bus 450, a user interface 600, and a power supply 700.

Data provided through the user interface 600 or processed by the CPU 500 is stored in the variable resistance memory device 100. The semiconductor memory device 300 may be comprised of a solid-state drive (SSD). In this case, a write speed of the memory system 1000 may be dramatically enhanced.

Although not shown in the figure, it will be understood by those skilled in the art that an application chipset, a camera image processor (CIS), and a mobile DRAM may be further provided for a memory system according to the present invention.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A nonvolatile memory device, comprising:
    an array of variable-resistance memory cells; and
    a write driver configured to drive a bit line in said array of variable-resistance memory cells with a stair-step sequence of at least two unequal bit line voltages during an operation to program a variable-resistance memory cell in said array;
    wherein said write driver is configured to drive the bit line with a first stair-step sequence of at least two unequal bit line voltages during an operation to program the variable-resistance memory cell into a set state;
    wherein said write driver is configured to drive the bit line with a second stair-step sequence of at least two unequal bit line voltages during an operation to program the variable-resistance memory cell into a reset state; and
    wherein magnitudes of the voltages in the first stair-step sequence are equivalent to magnitudes of the voltages in the second stair-step sequence.

2. The memory device of claim 1, wherein a duration of the first stair-step sequence is unequal to a duration of the second stair-step sequence.

3. The memory device of claim 1, wherein a duration of the first stair-step sequence is greater than a duration of the second stair-step sequence.

4. A nonvolatile memory device, comprising:
    an array of variable-resistance memory cells; and
    a write driver configured to drive a bit line in said array of variable-resistance memory cells with a stair-step sequence of at least two unequal bit line voltages during an operation to program a variable-resistance memory cell in said array;
    wherein said write driver is configured to drive the bit line with a first stair-step sequence of at least two unequal bit line voltages during an operation to program the variable-resistance memory cell into a set state;
    wherein said write driver is configured to drive the bit line with a second stair-step sequence of at least two unequal bit line voltages during an operation to program the variable-resistance memory cell into a reset state; and
    wherein a duration of the first stair-step sequence is greater than a duration of the second stair-step sequence.

5. A nonvolatile memory device, comprising:
    an array of variable-resistance memory cells; and
    a write driver configured to drive a bit line in said array of variable-resistance memory cells with a stair-step sequence of at least two unequal bit line voltages during an operation to program a variable-resistance memory cell in said array, said write driver comprising a precharge circuit configured to precharge the bit line with a first of the at least two unequal bit line voltages in response to a precharge control signal.

6. The memory device of claim 5, wherein said write driver is configured so that a magnitude of the first of the at least two unequal bit line voltages is independent of whether the variable-resistance memory cell is being programmed into the set state or reset state.

7. The memory device of claim 5, wherein said write driver comprises a current driver having a PMOS pull-up transistor and an NMOS pull-down transistor therein, electrically coupled in series; and wherein the precharge circuit is configured to pull-up an output of the current driver when enabled during the program operation.

8. A nonvolatile memory device, comprising:
    an array of variable-resistance memory cells; and
    a write driver configured to drive a bit line in said array of variable-resistance memory cells with a stair-step sequence of at least two unequal bit line voltages during an operation to program a variable-resistance memory cell in said array, said write driver comprising:
        a current driver having a PMOS pull-up transistor and an NMOS pull-down transistor therein, electrically coupled in series;
        a precharge circuit electrically coupled to an output of said current driver;
        a current control circuit having an output electrically coupled to a gate electrode of the PMOS pull-up transistor; and
        a pulse selection circuit electrically coupled to said current control circuit and a gate electrode of the NMOS pull-down transistor, said pulse selection circuit responsive to a data signal and reset and set pulse signals.

9. The memory device of claim 8, wherein said pulse selection circuit is configured to pass the data signal to said current control circuit.

10. The memory device of claim 8, wherein said current control circuit is responsive to a bias signal and a data signal generated by said pulse selection circuit.

11. The memory device of claim 8, further comprising:
    a global bit line selection circuit electrically coupled to the output of said current driver; and
    a local bit line selection circuit electrically coupled to an output of said global bit line selection circuit and the bit line in said array of variable-resistance memory cells.

12. A variable resistance memory device comprising:
    a memory cell connected to a bitline; and
    a write driver driven by a boosted voltage and configured to supply program current to the memory cell,
    wherein the write driver includes a precharge unit configured to precharge the bitline to a lower voltage than the boosted voltage before supplying the program current.

13. The variable resistance memory device of claim 12, wherein the write driver comprises:
    a pulse selection unit configured to output either one of reset and set pulses and data in response to a logic level of the data;
    a current control unit configured to receive a bias voltage and output an output signal to a second control level during an enable duration of the reset pulse when the logic level of the data is a first level and output the output signal to a first control level during an enable duration of the set pulse when the logic level of the data is a second level; and
    a current driving unit configured to output the program current to the bitline through an output node in response to the output signal during the enable duration of the reset or set pulse and discharge the bitline during a disable duration of the reset or set pulse.

14. The variable resistance memory device of claim 13, wherein the precharge unit is a MOS transistor coupled between a power terminal and the output node of the current driving unit and controlled by a precharge control signal.

15. The variable resistance memory device of claim 14, wherein the precharge unit is an NMOS transistor.

16. The variable resistance memory device of claim 14, wherein the bitline includes a plurality of global bitlines and a plurality of local bitlines; and
   wherein each of the global bitlines is connected to the plurality of local bitlines, and a plurality of memory cells are connected to each of the local bitlines.

17. The variable resistance memory device of claim 16, further comprising:
   a global bitline selection unit configured to select one of the global bitlines and connect the selected global bitline to the write driver; and
   a local bitline selection unit configured to select one of the local bitlines and connect the selected local bitline to the selected global bitline.

18. The variable resistance memory device of claim 17, wherein the selected global bitline is connected to the output node of the current driving unit.

19. The variable resistance memory device of claim 12, wherein the memory cell comprises:
   a memory element including a phase change material; and
   a selection element configured to select the memory element.

* * * * *